United States Patent
Yu et al.

(10) Patent No.: US 10,859,922 B1
(45) Date of Patent: Dec. 8, 2020

(54) LITHOGRAPHY SYSTEM AND METHOD

(71) Applicant: Taiwan Semiconductor Manufacturing Company, Ltd., Hsinchu (TW)

(72) Inventors: Chen-Hua Yu, Hsinchu (TW); Ming-Tan Lee, Kaohsiung (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/515,245

(22) Filed: Jul. 18, 2019

(51) Int. Cl.
*G03F 7/20* (2006.01)

(52) U.S. Cl.
CPC ...... *G03F 7/70558* (2013.01); *G03F 7/70308* (2013.01); *G03F 7/70625* (2013.01); *G03F 7/70641* (2013.01); *G03F 7/70775* (2013.01); *G03F 7/7085* (2013.01)

(58) Field of Classification Search
CPC ........ G03F 9/70; G03F 9/7003; G03F 9/7007; G03F 9/7011; G03F 9/7015; G03F 9/7023; G03F 9/7026–7034; G03F 9/7096; G03F 7/70641; G03F 7/70625; G03F 7/70308; G03F 7/70316; G03F 7/70091; G03F 7/701; G03F 7/70608; G03F 7/70616; G03F 7/70666; G03F 7/70675; G03F 7/70683; G03F 7/707; G03F 7/70716; G03F 7/70725; G03F 7/70775; G03F 7/7085; G03F 7/7055; G03F 7/70558; G03F 7/70191; G03F 7/70066

USPC .............. 355/30, 52–56, 67, 71, 72–74, 77; 250/492.1, 492.2, 492.22, 492.3, 493.1, 250/503.1, 504 R; 356/601–609, 612, 356/614, 615–624, 625, 630, 399–401
See application file for complete search history.

(56) References Cited

U.S. PATENT DOCUMENTS

| | | | |
|---|---|---|---|
| 6,020,950 A * | 2/2000 | Shiraishi | G03F 7/70241 355/30 |
| 6,295,629 B1 * | 9/2001 | Suganaga | G03F 7/70641 430/5 |
| 8,527,916 B1 | 9/2013 | Chiang et al. | |
| 8,572,520 B2 | 10/2013 | Chou et al. | |
| 8,589,828 B2 | 11/2013 | Lee et al. | |
| 8,589,830 B2 | 11/2013 | Chang et al. | |
| 8,627,241 B2 | 1/2014 | Wang et al. | |
| 8,631,360 B2 | 1/2014 | Wang et al. | |
| 8,631,361 B2 | 1/2014 | Feng | |
| 8,732,626 B2 | 5/2014 | Liu et al. | |

(Continued)

*Primary Examiner* — Christina A Riddle
(74) *Attorney, Agent, or Firm* — Slater Matsil, LLP

(57) ABSTRACT

A method includes placing a substrate on a stage of a lithography system, measuring a first height of the substrate at a first location on the substrate, measuring a second height of the substrate at a second location on the substrate, and performing a lithographic patterning process on the substrate, comprising directing a patterned beam of radiation at the substrate, moving the stage laterally to align the first location of the substrate with the patterned beam, moving the stage vertically to a first vertical position, the first vertical position based on the first height, moving the stage laterally to align the second location of the substrate with the patterned beam, and moving the stage vertically to a second vertical position, the second vertical position based on the second height.

20 Claims, 10 Drawing Sheets

(56) References Cited

U.S. PATENT DOCUMENTS

| | | |
|---|---|---|
| 8,739,080 B1 | 5/2014 | Tsai et al. |
| 8,745,550 B2 | 6/2014 | Cheng et al. |
| 8,751,976 B2 | 6/2014 | Tsai et al. |
| 8,762,900 B2 | 6/2014 | Shin et al. |
| 8,812,999 B2 | 8/2014 | Liu et al. |
| 8,850,366 B2 | 9/2014 | Liu et al. |
| 2007/0229791 A1* | 10/2007 | Inoue ................ G01B 11/0608 355/67 |
| 2009/0208884 A1* | 8/2009 | Hanawa .............. G03F 7/70258 430/325 |
| 2010/0203433 A1* | 8/2010 | Murata .............. G03F 7/70433 430/30 |
| 2011/0045613 A1* | 2/2011 | Suzuki ................ G03F 7/70425 438/7 |
| 2013/0267047 A1 | 10/2013 | Shih et al. |
| 2014/0101624 A1 | 4/2014 | Wu et al. |
| 2014/0109026 A1 | 4/2014 | Wang et al. |
| 2014/0120459 A1 | 5/2014 | Liu et al. |
| 2014/0282334 A1 | 9/2014 | Hu et al. |

\* cited by examiner

LITHOGRAPHY SYSTEM AND METHOD

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of processing and manufacturing ICs and, for these advances to be realized, similar developments in IC processing and manufacturing are needed. For example, the need to perform higher resolution lithography processes grows. Some next-generation lithography techniques being explored include extreme ultraviolet (EUV) lithography, deep ultraviolet (DUV) lithography, X-ray lithography, soft X-ray (SX) lithography, ion beam projection lithography, electron-beam projection lithography, and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
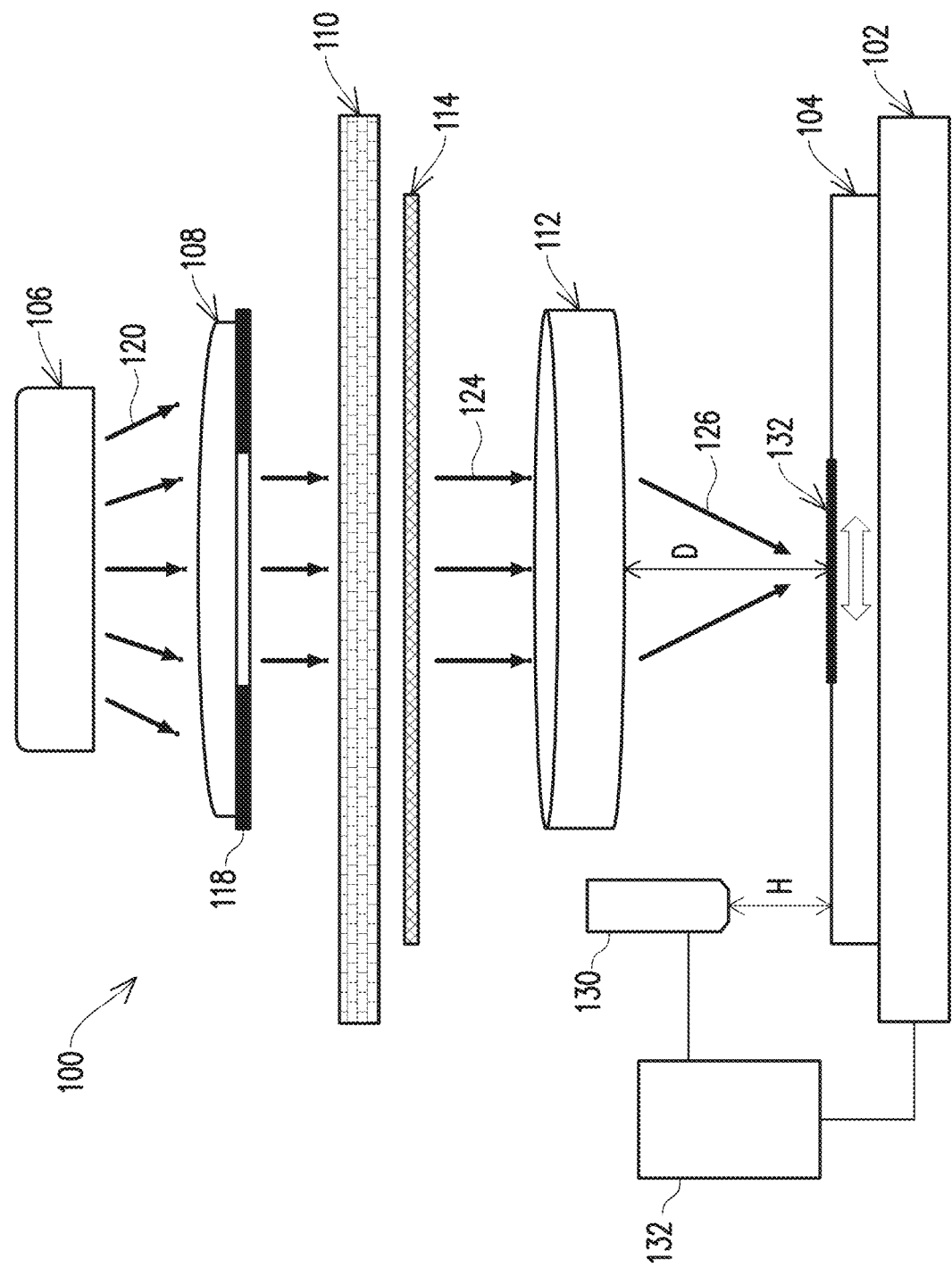
FIG. 1 illustrates a schematic of a lithography system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein relate to a lithography system and lithographic processes used in the manufacturing of semiconductor devices and semiconductor packages. In some embodiments, during a scanning lithographic process performed on a substrate (e.g., a wafer), the vertical position of the stage holding the substrate is adjusted based on a height of the substrate in the region being illuminated. The vertical position of the stage may be adjusted during scanning to maintain the illuminated surface of the substrate at or near a focal plane of the lithography system. Locations of the substrate may be assigned to a height zone based on a height of the substrate at each location. The vertical position of the stage may be adjusted based on the height zone of location being illuminated. In some embodiments, a height map of a substrate may be generated, and the vertical position of the stage adjusted based on the location according to the height map. Additionally, an exposure shield may be used to control the exposure dose of the illuminated location based on its height. By adjusting the vertical position of the stage according to the height of a location on a substrate, the patterning of a substrate may be improved.

FIG. 1 illustrates a schematic diagram of a lithography system 100, in accordance with some embodiments. The lithography system 100 includes a radiation source 106, an illuminator system 108, a mask 110, and a projection optics system 112. The lithography system 100 also includes a target comprising a substrate 104 mounted on a stage 102 and also includes a topography sensor 130. In other embodiments, the lithography system 100 may have a different configuration than shown, and may comprise different components, combinations of components, or arrangements of components. The lithography system 100 may also include a controller 132 configured to receive signals from, transmit signals to, and otherwise control the components of the lithography system 100 such as the stage 102, the slit 118 (described below), the topography sensor 130, the radiation source 106, or other components of the lithography system 100. In an embodiment, the lithography system 100 is an ultraviolet lithography system, which may be, e.g., an i-line lithography system, a ghi-line lithography system, a backend field lithography system, the like, or a combination thereof. In other embodiments, the lithography system 100 is a deep ultraviolet (DUV) lithography system, an extreme ultraviolet (EUV) lithography system, an X-ray lithography system, a soft X-ray (SX) lithography system, an ion beam projection lithography system, an electron-beam projection lithography system, or the like. (Current, we use I-line or GHI-line lithography system in backend field.)

The radiation source 106 provides electromagnetic radiation 120 having a wavelength in a desired range. The radiation 120 produced by the radiation source 106 may be generated using a suitable technique, such as using a plasma source, a laser induced source, an electrical discharge gas plasma source, or the like. Example plasma sources include xenon, oxygen, lithium, and the like. In some embodiments, a plasma source may use a high-temperature and high-density plasma, a laser-produced plasma (LPP), or a discharge-produced plasma (DPP). In some embodiments where the lithography system 100 is an EUV lithography system, the radiation source 106 produces EUV radiation (e.g. radiation 120) using a plasma source. In some embodiments, the radiation source 106 may produce EUV radiation having a wavelength between about 1 nm and about 100 nm, such as a wavelength centered at about 13.5 nm. Other types of radiation sources 106 and other types of radiation 120 may be used in other embodiments.

Still referring to FIG. 1, the radiation 120 produced by the radiation source 106 is received by the illuminator system 108. In some embodiments, the illuminator system 108 includes various optical components that may, for example, condense the radiation 120 from the radiation source 106 and direct radiation 120 toward the mask 110 as incident radiation beam 122. In some embodiments, the illuminator system 108 includes refractive optical components, such as a single lens or a lens system comprising multiple lenses (e.g., zone plates). In some embodiments, the illuminator system 108 comprises reflective optical components, such as a single mirror or a mirror system comprising multiple mirrors. The illuminator system 108 may include a combination of refractive optical components and reflective optical components in some embodiments. In embodiments in which the lithography system 100 is an EUV lithography system, the illuminator system 108 may include reflective optical components.

In some embodiments, the illuminator system 108 comprises a moveable slit 118 that blocks portions of the radiation 120 not transmitted through the slit 118. In this manner, the incident radiation beam 122 impinges only on a region of the mask 110 determined by a corresponding location of the slit 118. The moveable slit 118 may be configured to be linearly translated (e.g., "scanned") during a lithography process to illuminate portions of the mask 110 as the substrate 104 is linearly translated (e.g. by the stage 102) in a direction opposite to the direction of translation of the slit 118. In this manner, the pattern of the mask 110 may be illuminated across the entire substrate 104 in a single scanning step (e.g., a "full wafer scan"). An example scanning lithography process is described in greater detail below with regard to FIG. 2. By transferring the mask pattern in larger scanning steps, a lithography process can achieve a larger field and thus be used during the manufacture of devices having larger areas. For example, the lithography system 100 may be used to manufacture devices having an area between about 10 mm$^2$ and about 100 mm$^2$ in some embodiments, though the lithography system 100 may be used to manufacture devices having a greater or smaller area in other embodiments.

Still referring to FIG. 1, the mask 110 patterns the incident radiation beam 122 with a pattern that will be formed in a photosensitive layer (not shown, described below) disposed on the substrate 104, thereby producing a patterned radiation beam 124. For example, circuit patterns (e.g., the design of a layer of an integrated circuit (IC) device or chip) may be formed on the mask 110. The mask 110 is then used to transfer the circuit patterns onto the substrate 104. The patterns may be transferred repeatedly onto multiple wafers through various lithography processes. Several masks 110 (for example, a set of 15 to 30 masks) may be used to pattern a complete IC device on the substrate 104. The mask 110 may be held by a chuck or other type of mounting apparatus (not shown), which may be configured to translate, rotate, or tilt the mask 110. The mask 110 may be, for example, a transmissive mask, a reflective mask (sometimes referred to as a "reticle"), an optical proximity correction (OPC) mask, or the like. In embodiments where the lithography system 100 is an EUV lithography system, the mask 110 may be a reflective mask. In some embodiments, an exposure shield 114 may be disposed in the radiation beam before or after the mask 110 to control the exposure dose of radiation received by the substrate 104, or may be disposed elsewhere within the lithography system 100. Example exposure shields 814A-D are described below with respect to FIG. 8.

The projection optics system 112 is configured to receive the patterned radiation beam 112 transmitted by (or reflected from) the mask 110 and project it onto the substrate 104 as incident radiation 126. The projection optics system 112 may also be called a "projection optics module" or "projection optics box (POB)." The projection optics system 112 may magnify the patterned radiation beam 124, and may magnify the patterned radiation beam 124 with a magnification of less than one, thereby reducing the patterned image of the patterned radiation beam 124. The projection optics system 112 may include refractive optical components, reflective optical components, or a combination. The projection optics system 112 may focus the incident radiation 126 onto the substrate 104, and may be positioned at a focal distance D from the substrate 104. In some cases, the focal distance D may be a distance from the substrate 104 that corresponds to the surface of the substrate 104 being at or near a focal plane 132 of projection optics system 112. In some cases, having the surface of the substrate 104 at or near the focal plane 132 may improve lithographic characteristics, such as improved pattern definition of smaller features.

The substrate 104 may be, for example, a target substrate having a photosensitive layer (not shown) disposed thereon. The target substrate may be, e.g., a semiconductor wafer, and may be formed from a semiconductor material such as silicon, germanium, gallium arsenide, the like, or a combination thereof. In some embodiments, the substrate may include a compound semiconductor, an alloy semiconductor, the like, or a combination thereof. Further, the substrate 104 may optionally include one or more epitaxial layers, which may be strained for performance enhancement. The substrate 104 may include a silicon-on-insulator (SOI) structure or include other suitable enhancement features. The substrate 104 may include a plurality of dies formed or partially formed thereon. Each die may include any number of semiconductor devices, such as field effect transistors (FETs, e.g., FinFETs, MOSFETs), capacitors, resistors, conductive interconnects, chips, and/or other suitable devices. The substrate 104 may also include one or more metallization layers (e.g., redistribution layers). The substrate 104 may include various doped regions comprising suitable N-type or P-type dopants or impurities. In some embodiments, the doped regions include active regions within which MOS devices can be formed. In some cases, the active regions may be doped to form well regions. The boundaries of the active regions may be defined by isolation structures such as shallow trench isolation (STI) features. The photosensitive layer may be a material that is sensitive to the radiation of the incident radiation 126, and may be, for example, a photoresist (e.g., a positive resist or a negative resist), a photosensitive polymer, the like, or a combination thereof. The photosensitive layer may be formed on the substrate 104 by a suitable process such as spin-on coating, lamination, deposition, the like, or a combination thereof.

Still referring to FIG. 1, the substrate 104 is mounted on (e.g., secured by) stage 102. The stage 102 is configured to be translated, raised, rotated, tilted, or otherwise adjusted to reposition the orientation of the substrate 104. The stage 102 may move based on signals received from the controller 132, in some embodiments. For example, the stage 102 may be configured to tilt the substrate 104 in order to level the substrate 104. The stage 104 may also be configured to linearly translate the substrate 104 along one axis (e.g., along an X-axis) or along two axes (e.g., along both X- and Y-axes). For example, the stage 102 may linearly translate the substrate 104 in a direction opposite that of the slit 118 during a scanning lithography process. The stage 102 may also be configured to raise or lower the substrate 104 (e.g., along a Z-axis), for example, in order to increase, decrease, or maintain the focal distance D between the projection optics system 112 and the substrate 104. In some embodiments, the stage 102 may raise or lower the substrate 104 in order to maintain the illuminated region of substrate 104 at the focal distance D from the projection optics system 112 (corresponding to the focal plane 132) during a scanning lithography process, described in greater detail below.

The lithography system 100 also includes a topography sensor 130. The topography sensor 130 is configured to determine a height H of a point on the surface of the substrate 104 relative to a fixed height. The topography sensor 130 may be, for example, an air probe, an optical sensor (e.g., a photodetector sensing a laser reflected off the substrate 104), or another type of sensor. In some embodiments, the topography sensor 130 may measure the relative heights of one or more points on the surface of the substrate 104, and the heights of the points used to adjust the stage 102 to level the substrate 104 based on the measured heights (see FIG. 3). In some embodiments, the topography sensor 130 may be used to make a topographical map of a region of the substrate 104 or the entire substrate 104 (see FIG. 5). The topography sensor 130 may be connected to the controller 132 and transmit height information to the controller 132, in some embodiments.

Figure 2:
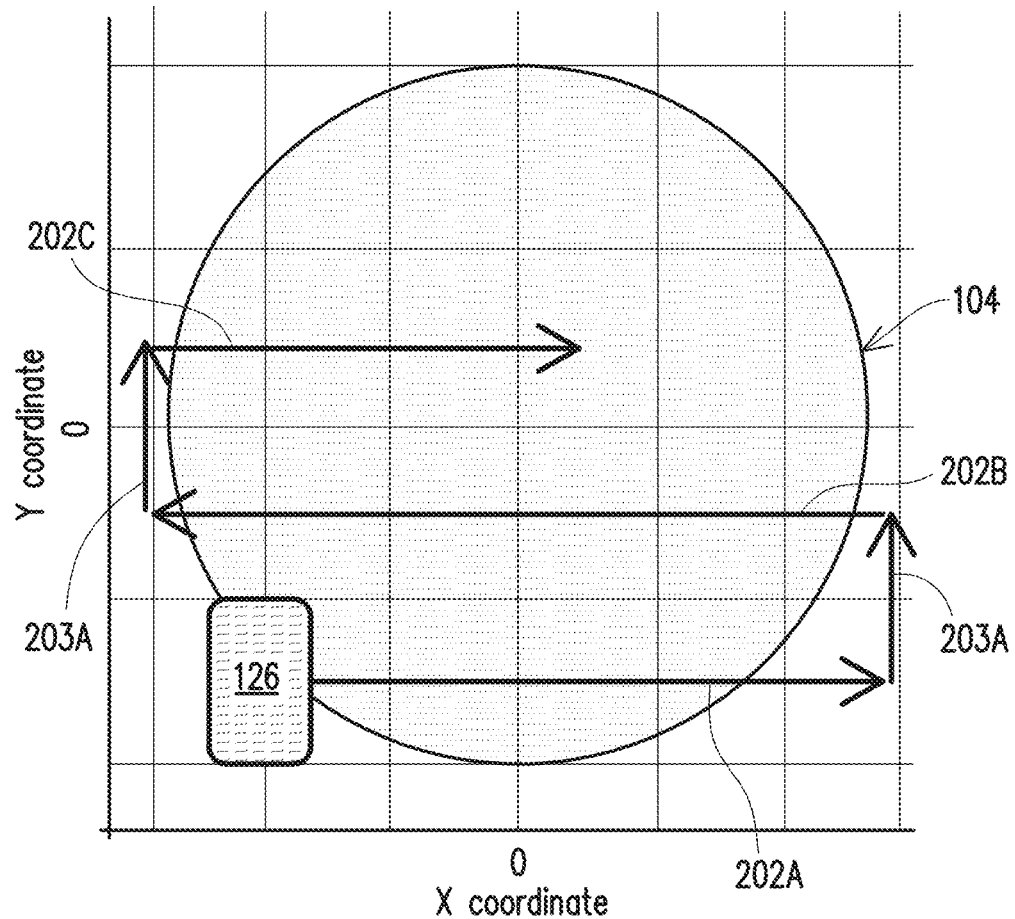
FIG. 2 illustrates a portion of a scanning lithography process, in accordance with some embodiments.

Turning to FIG. 2, an example portion of a scanning lithography process is shown, in accordance with some embodiments. FIG. 2 shows a plan view of substrate 104 and example scanning paths 202A-C of the incident radiation 126 on the substrate 104. Each scanning path 202A-C corresponds to a lithographic scanning step. In each scanning path 202A-C, the slit 118 is translated such that the incident radiation beam 122 is transmitted through different regions of the mask 110. As the slit is translated in one direction, the stage 102 translates the substrate 104 in the opposite direction. Thus, the regions of the substrate 104 along the scanning paths 202A-C are illuminated by incident radiation 126 having a pattern from a corresponding region of the mask 110. In this manner, during each scanning path 202A-C, the incident radiation 126 may be scanned across a full length the substrate 204, transferring the pattern of the mask 110 to the substrate 104 across a full length of the substrate 104.

As an example, FIG. 2 shows a first scanning path 202A that scans along X-coordinates of the substrate 104 at a first fixed Y-coordinate, transferring the pattern of the mask 110 along the full length of the substrate 104 in an X-direction. After the first scanning path 202A, the slit 118 and/or the substrate 104 may be translated at step 203A such that the incident radiation 126 is repositioned at a different Y-coordinate. The incident radiation 126 may then be scanned in an X-direction along the second scanning path 202B at a second fixed Y-coordinate. As shown in FIG. 2, the second scanning path 202B may be scanned in an opposite X-direction to that of the first scanning path 202A. During the second scanning path 202B, the slit 118 and substrate 104 may be translated in directions opposite to that used for the first scanning path 202A. After the second scanning path 202B, the incident radiation 126 may be repositioned in step 203A and then scanned across the substrate 104 along the third scanning path 202C. In this manner, the incident radiation 126 may be scanned over the substrate 104 in a raster pattern. In some cases, scanning across the full length of the substrate 104 in each scanning step may avoid the need for stitching, and thus may avoid lithographic defects associated with stitching. Additional scanning paths may be used to fully pattern the entire substrate 104. In other embodiments, a scanning path may not extend fully across the substrate 104, or only a portion of the entire substrate 104 may be patterned. The scanning lithography process shown in FIG. 2 is intended to be an illustrative example, and some embodiments may include processes or techniques that differ from the process shown in FIG. 2. For example, in other embodiments, the substrate 104 may remain stationary during the process and appropriate components of the lithography system 100 are translated or otherwise operated. In other embodiments, the lithography system 100 may be stationary and the substrate 104 is translated.

Figure 3:
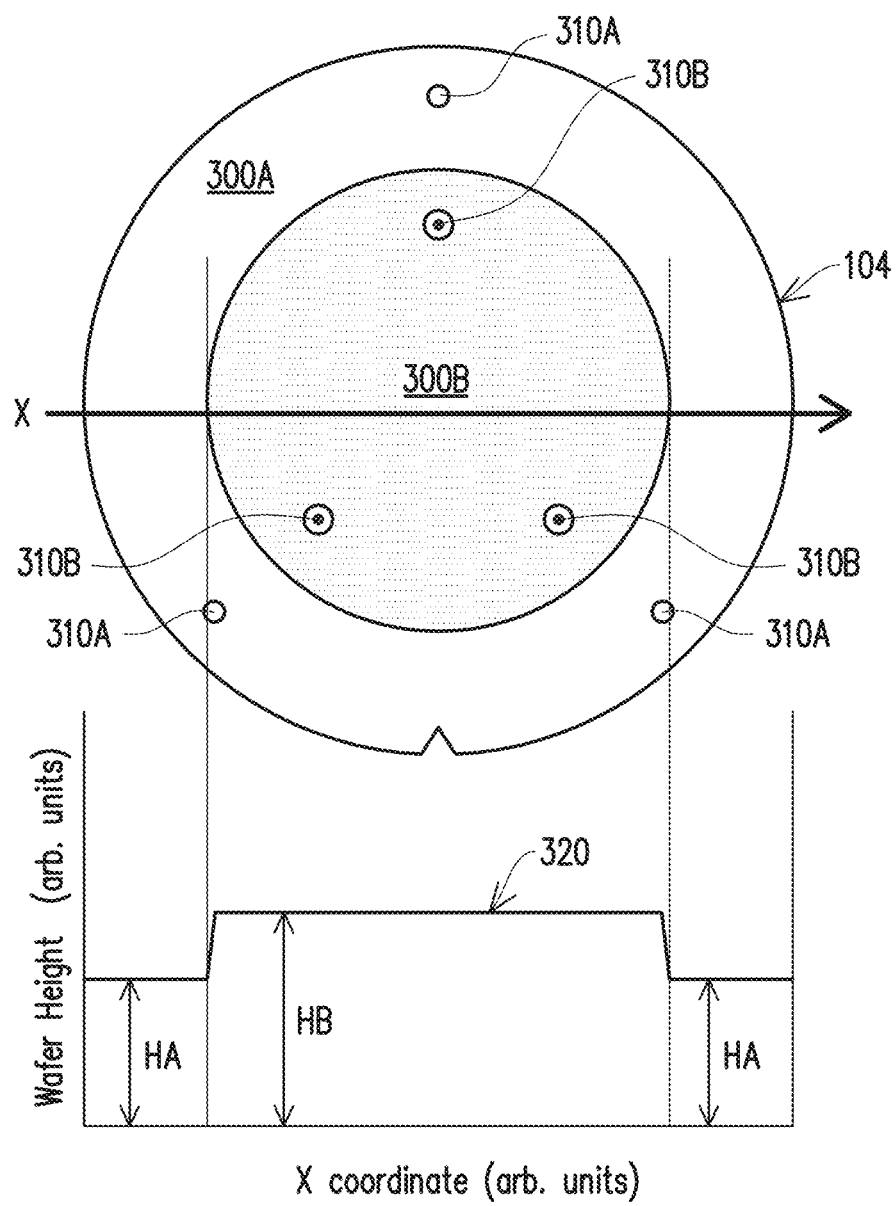
FIG. 3 illustrates a substrate having height zones, in accordance with some embodiments.

Turning to FIG. 3, an illustration of an example substrate 104 having multiple height zones 300A-B is shown, in accordance with some embodiments. FIG. 3 also shows a representative height profile 320 of the substrate 104, taken along an X-direction as labeled. In some cases, a substrate 104 may have a warped or uneven surface, such that different regions of the top surface of the substrate 104 may have different relative heights. For example, the substrate 104 may be warped during the manufacture of relatively thick or relatively large devices. In some cases, the formation of devices having a thickness between about 1000 μm and about 1500 μm may cause a variation in height (e.g., due to warping) that is between about 0 μm and about 50 μm.

This is shown in FIG. 3, in which the example substrate 104 is warped such the outer portions of the substrate are lower than the inner portions of the substrate. As shown in the height profile 320, the outer portions of the substrate have a height of about HA and are designated as height zone 300A. The inner portions of the substrate 104 have a height of about HB and are designated as height zone 300B. In some embodiments, the heights or height zones of a substrate 104 may be determined using a topographic sensor such as topographic sensor 130, shown in FIG. 1. It should be understood that the example shown in FIG. 3 is intended as illustrative, and in other cases a substrate may have different height profiles, differently shaped height zones, or a different number of height zones. These and other variations are considered within the scope of this disclosure.

As described above, the lithography system 100 may have a focal distance D corresponding to a focal plane 132 of the projection optics system 112. In some cases, surface regions of the substrate 104 that do not coincide with the focal plane 132 (e.g., are above or below the focal plane 132) may result in a poorer quality patterning of those regions. For example, if the vertical position of the stage 102 is fixed during a linear translation of the stage 102 in a lithographic scanning step, some surface regions of a warped substrate 104 may be above or below the focal plane 132 as the stage 102 is translated, and thus those surface regions may have poorer pattern quality.

Turning to FIGS. 4A-D, illustrations of an example lithographic scanning process are shown, in accordance with some embodiments. The lithographic scanning process shown in FIGS. 4A-D may be implemented by a lithographic system such as lithography system 100 shown in FIG. 1. In some embodiments, the lithography system 100 includes a stage 102 that raises or lowers the substrate 104 during a lithographic scanning step in order to keep more surface regions of the substrate 104 at or near the focal plane 132 (e.g., near the focal distance D from the projection optics system 112), and thus improve the overall patterning quality of the substrate 104.

Figure 4A:
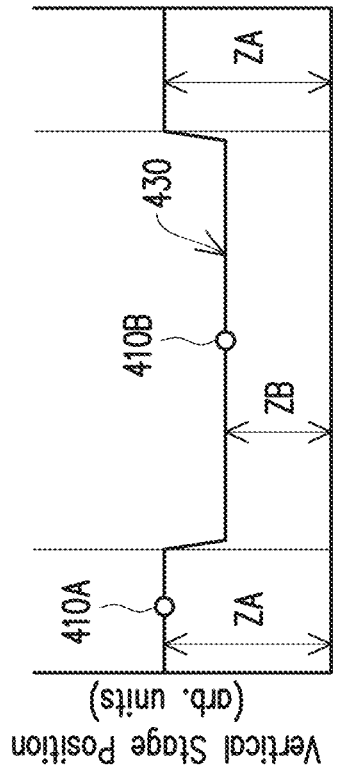
FIGS. 4A-D illustrate a lithographic scanning process, in accordance with some embodiments.

FIG. 4A illustrates an example height profile 320 of a substrate 104, in accordance with some embodiments. The height profile 320 shown in FIG. 4A is similar to height profile 320 shown in FIG. 3, and shows heights of the substrate 104 along X-coordinates (e.g., across the substrate 104 in an X-direction) at a fixed Y-coordinate. As shown in FIG. 4A, regions of the substrate 104 have different relative heights. For example, the location 400A of the substrate 104 (shown on the height profile 320 as point 400A) has a height HA, and the location 400B of the substrate 104 (shown on the height profile 320 as point 400B) has a height HB that is greater than height HA.

Figure 4B:
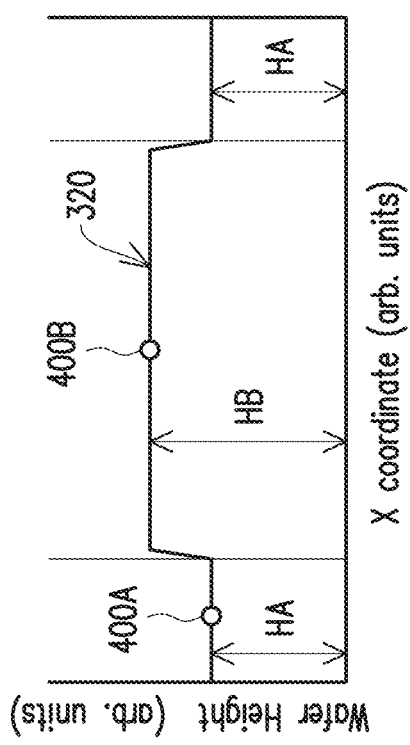

FIG. 4B illustrates an example vertical position profile 430 of the stage 102 holding the substrate 104. The vertical position profile 430 represents relative vertical positions of the stage 102 for locations on substrate 104. In particular, the vertical position profile 430 represents vertical positions of the stage 102 that compensate for the substrate 104 height at each X-coordinate of height profile 320. In other words, a location of the substrate 104 may have a corresponding vertical position of the stage 102 such that the surface of the substrate 104 at that location is about a certain vertical distance from a fixed reference point when the stage 102 is adjusted to have that vertical position, in some embodiments. A vertical position profile of the stage 102 may comprise one or more vertical position values that are determined from one or more height values of the substrate 104 and/or one or more locations on the substrate 104, described in greater detail below. A vertical position profile may be generated from an individual substrate and used for that individual substrate, or may be generated from one or more substrates and used for one or more substrates.

Figure 4C:
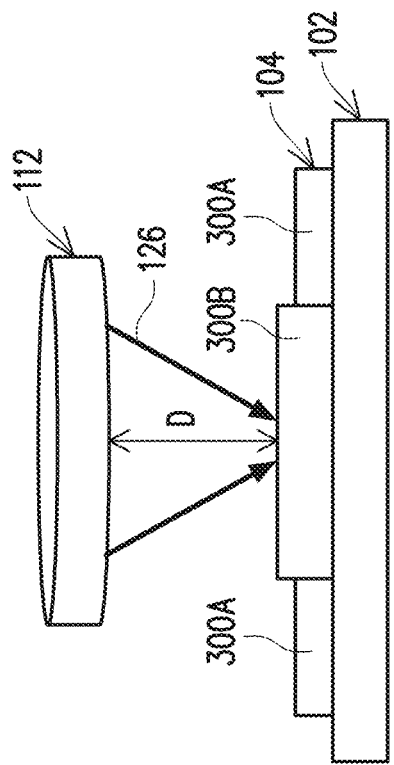
Figure 4D:
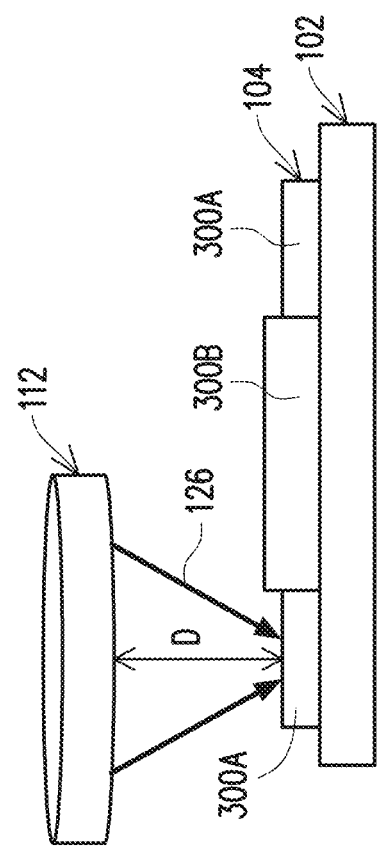

For example, as shown in FIGS. 4A-B, locations 400A and 400B of the substrate 104 have corresponding vertical positions 410A and 410B of the stage 102. When the stage 102 has the vertical position 410A associated with location 400A, the surface of the substrate 104 at location 400A is about the focal distance D from the projection optics system 112 (and thus is about at the focal plane 132). This is shown in FIG. 4C, which illustrates a portion of the lithography system 100 when the stage 102 has positioned the wafer at location 400A and is at vertical position 410A. Similarly, when the stage 102 has the vertical position 410B associated with location 400B, the surface of the substrate 104 at location 400B is also about the focal distance D from the projection optics system 112 (and thus is also about at the focal plane 132). This is shown in FIG. 4D, which illustrates a portion of the same lithography system 100 when the stage 102 has positioned the wafer at location 400B and is at vertical position 410B. In this manner, the substrate 104 locations (e.g., 400A-B) may correspond to X- and Y-coordinates and the stage 102 vertical positions (e.g., 410A-B) may correspond to Z-coordinates.

In some embodiments, the lithography system 100 may control the stage 102 based on a vertical position profile for a substrate 104. For example, during a lithographic scanning step, as the substrate 104 is linearly translated by the stage 102, the stage 102 may use the vertical position profile to continuously or discretely adjust its vertical position in order to maintain the surface region of the substrate 104 that is being patterned (e.g., illuminated by the incident radiation 126) at or near the focal plane 132. For example, FIGS. 4C-D can also represent portions of a single lithographic scanning step, in which the stage 102 has maintained the illuminated surface of the substrate 104 near the focal distance D from the projection optics system 112 despite the substrate 104 having different surface heights at different locations.

Figure 5:
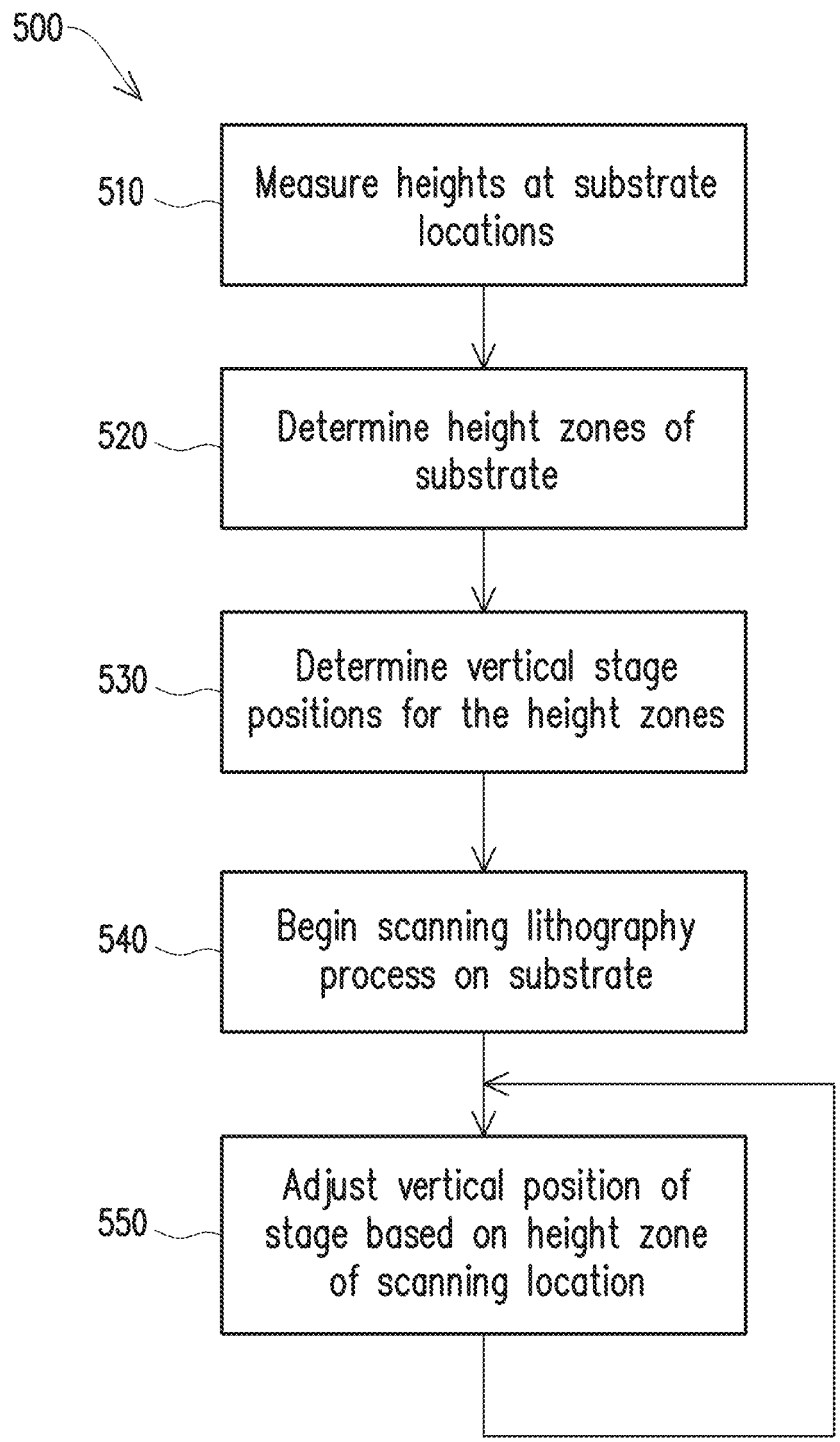
FIG. 5 illustrates a process flow for a lithography process, in accordance with some embodiments.

Turning to FIG. 5, a process flow for a lithography process 500 is shown, in accordance with some embodiments. The process 500 may be performed on a substrate similar to the substrate 104 described in FIG. 1, and may be performed using a lithography system similar to the lithography system 100 described in FIGS. 1, 2, and 4. At step 510, heights of the substrate at one or more locations on the substrate are measured. The heights may be measuring using, for example, the topography sensor 130 shown in FIG. 1. The locations may be associated with X- and Y-coordinates on the substrate. For example, a height H1 may be measured at location (X1,Y1) on the substrate, and a height H2 may be measured at location (X2, Y2) on the substrate. The measured heights may be relative to a fixed height value, and as such the measured heights may be positively or negatively valued. The height may be measured at one location or at multiple locations. For example, with reference to FIG. 3, a height of HA is measured at one or more of locations 310A on the substrate 104, and a height of HB is measured at one or more of locations 310B on the substrate 104.

At 520, one or more height zones of the substrate are determined, in accordance with some embodiments. A height zone represents a region of the substrate for which the same vertical position of the stage is used during a lithography scanning step. As an illustrative example, with reference to FIGS. 3 and 4A-D, two height zones 300A and 300B have been determined for the substrate 104. The height zone 300A corresponds to a region around a periphery of the substrate 104 having a measured height of about HA and the height zone 300B corresponds to a center region of the substrate having a measured height of about HB. While for clarity FIGS. 3 and 4A-D show the height zones as having about the same height within each height zone, in some cases a height zone may include locations of the substrate having varying heights or a range of heights.

The different height zones of a substrate may be predetermined or determined from height measurements of the substrate. For example, a height zone may represent regions of a substrate that are within a range of a particular height value. For example, the example height zone 300A shown in FIG. 3 represents regions of the substrate 104 that have a height of about HA. The particular height value or the range for a height zone may be predetermined, or may be determined from one or more height measurements of the substrate. For example, the particular height value may be determined from an average of height measurements, from a median height measurement, or from one or more height measurements using another technique. In some embodiments, a region of the substrate may be assigned to a height zone based on comparing a height measurement to other height measurements. For example, two height zones may be determined for a substrate after several height measurements of the substrate have been taken, in which the first height zone includes regions of the substrate having height measurements below a threshold height value and the second height zone includes regions of the substrate having height measurements above a threshold height value. For example, a threshold height value may be determined from some or all of the height measurements, and may be an average of measurements, a median of measurements, a fraction of the total range of measurements (e.g., halfway between the minimum measured height and maximum measured height), or may be determined using another technique. These are illustrative examples, and in other embodiments more than two height zones may be determined for a substrate, or the height zones for a substrate may be determined using different criteria or techniques than described herein.

In some embodiments, a height zone may also have stage adjustments other than vertical position associated with it. For example, the height measurements may be used to determine a stage tilt to level the substrate. In some embodiments, each height zone may have a different stage tilt based on height measurements within that height zone. For example, with reference to FIG. 3, the heights measured at points 310A may be used to determine a stage tilt associated with height zone 300A, and the heights measured at points 310B may be used to determine a stage tilt associated with height zone 300B. in some embodiments, three height measurements at different locations within each height zone may be used to determine a stage tilt for each height zone, though more or fewer measurements within each height zone may be used.

One height zone or multiple height zones may be determined. The example height zones 300A-B shown in FIG. 3 are circular in shape, but height zones may have other shapes in other embodiments, such as rectangles, polygons, ellipses, irregular shapes, etc. In some embodiments, a single height zone may be contiguous or be discontiguous. In some embodiments, a height zone may be represented as, e.g., a set of multiple X- and Y-coordinates, by a representation that is functionally equivalent to this, or by any suitable representation.

At 530, a vertical stage position is determined for each height zone, in accordance with some embodiments. The vertical stage position for a height zone is the vertical position of the stage used during a lithography scanning step when a location of the substrate within that height zone is being patterned. As an illustrative example, with reference to FIGS. 3 and 4A-D, two height zones 300A and 300B have been determined for the substrate 104. A vertical stage position ZA is determined for height zone 300A and a vertical stage position ZB is determined for height zone 300B.

The vertical stage position for a height zone may be determined from one or more height measurements of the substrate within that height zone. For example, with reference to FIGS. 4A-D, the vertical stage position ZA for height zone 300A may be determined from height HA. The vertical stage position ZA may be determined from a vertical stage position offset minus the value of HA, for example. A vertical stage position for a height zone may be determined from an average of height measurements, from a median height measurement, or from one or more height measurements using another technique. These are illustrative examples, and the vertical stage position for a height zone may be determined using different criteria or techniques than described herein. A vertical stage position may also include a stage tilt for substrate leveling, described previously.

At steps 540 and 550, a scanning lithography process is performed. The scanning lithography process may be similar to that described previously in FIGS. 1-2 and 4A-D. For example, as the illuminated pattern (e.g., incident radiation 126 in FIG. 2) is scanned over the substrate, the location of the illuminated region of the substrate corresponds to a particular height zone, and the stage is configured to adjust its vertical position to the vertical stage position associated with that height zone or maintain its vertical position at the vertical stage position associated with that height zone. In this manner, more of the surface of the substrate may be near the focal plane (e.g., focal plane 132 in FIG. 1) of the lithography system and thus the overall patterning of the substrate may be improved.

Figure 6A:
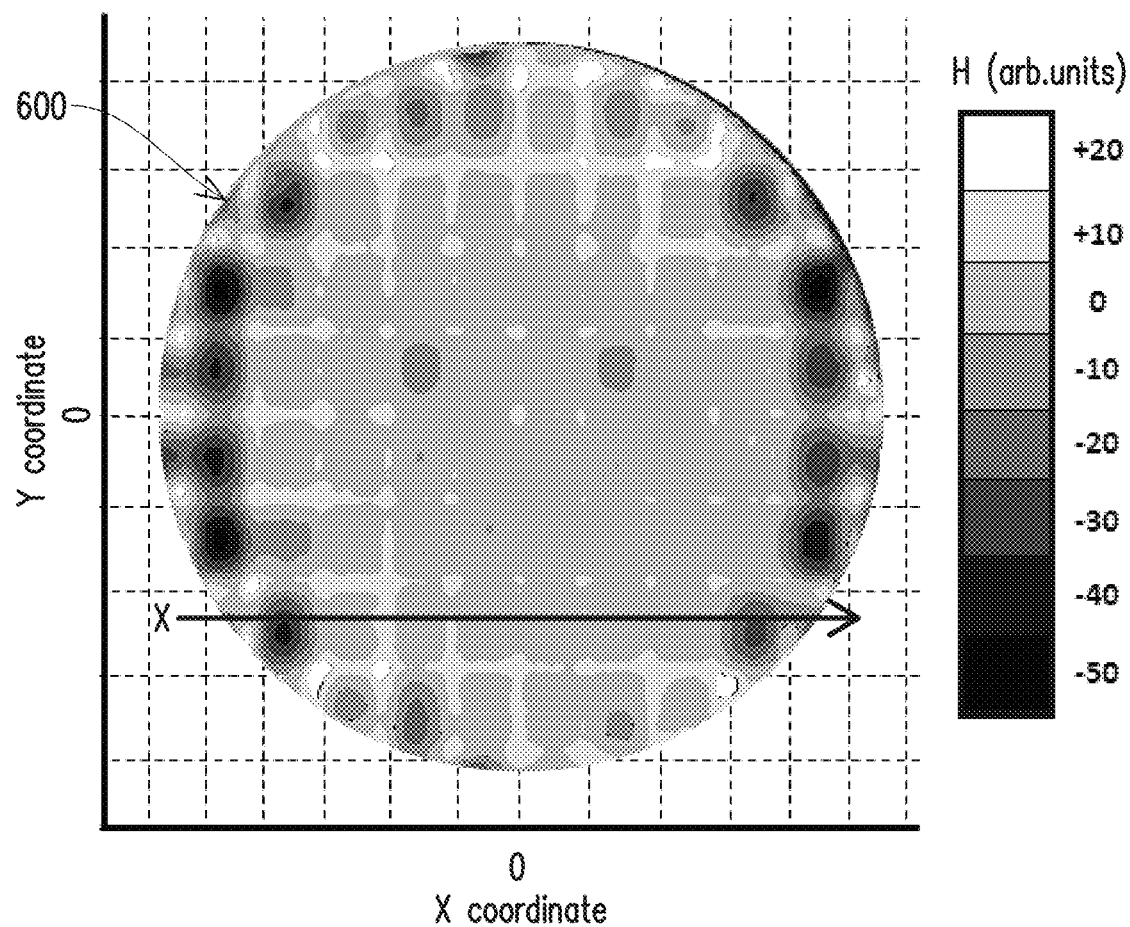
FIGS. 6A-B illustrate a height map of a substrate and a corresponding height profile, in accordance with some embodiments.
Figure 6B:
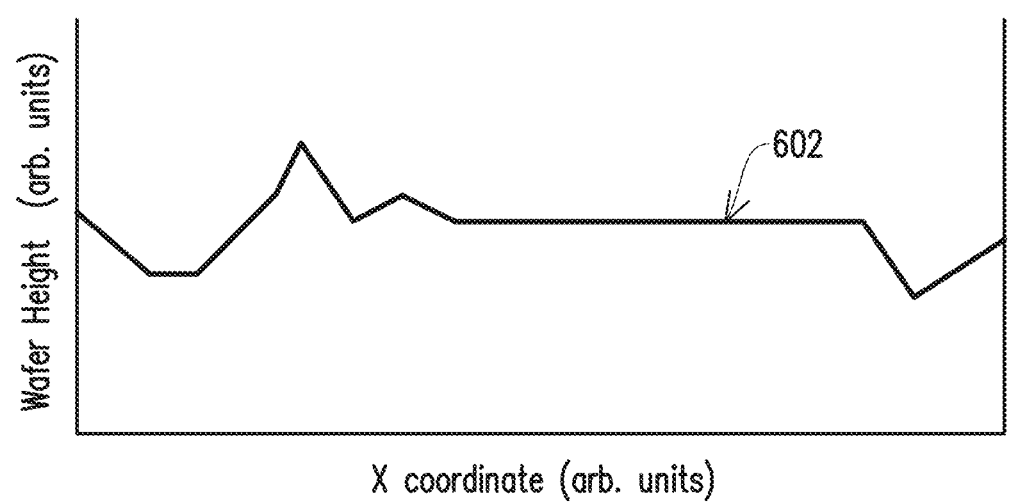

Turning to FIGS. 6A and 6B, an example height map 600 of a substrate and a corresponding height profile 602 are shown. The substrate may be similar to substrate 104 as described previously. As shown in FIG. 6A, the height map 600 includes a measured height value H for each location on the substrate. In some embodiments, each location of the substrate measured for the height map 600 may be considered a height zone containing only one location on the substrate. FIG. 6B shows an example height profile 602 across the substrate in the X-direction as labeled in FIG. 6A. A height map 600 may be generated for a substrate, and the vertical stage height may be adjusted during a lithography scanning step based on the height map 600 (described in greater detail with reference to FIG. 7). In some embodiments, the stage tilt may be adjusted to level a substrate based on a height map 600 of the substrate.

In some embodiments, a height map 600 of a substrate is generated by measuring the height of the substrate at multiple locations across the substrate. The height values of the height map 600 may be measured using, e.g., a topography sensor such as topography sensor 130 (see FIG. 1). Each substrate location and its corresponding height measurement value may be stored as the height map 600. For example, a location on the substrate may be stored as X- and Y-coordinates and the height at the location may be stored as a corresponding height value (e.g., a Z-coordinate). In this manner, a height map 600 may be a topographical map of the substrate. A height map 600 may include the entire surface of the substrate may include only a portion of the surface of the substrate.

Figure 7:
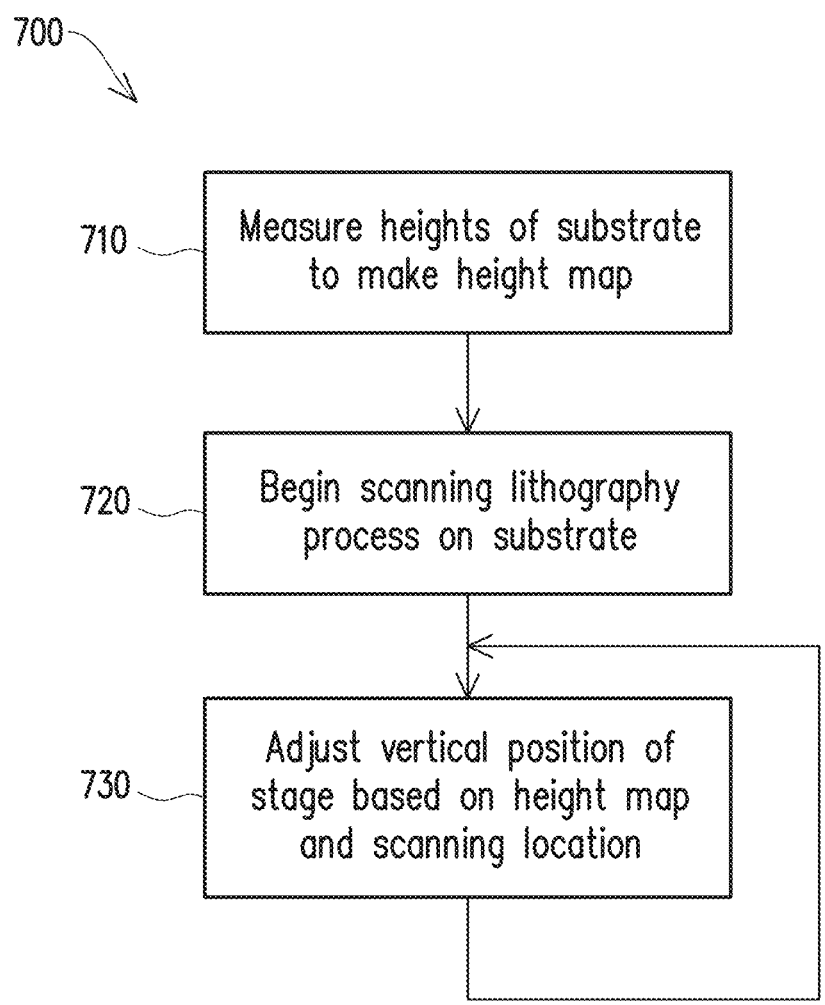
FIG. 7 illustrates a process flow for a lithography process, in accordance with some embodiments.

Turning to FIG. 7, a process flow for a lithography process 700 is shown, in accordance with some embodiments. The process 700 may be performed on a substrate similar to the substrate 104 described in FIG. 1, and may be performed using a lithography system similar to the lithography system 700 described in FIGS. 1,2, and 4. At step 710, heights of the substrate at multiple locations on the substrate are measured to generate a height map of the substrate. The height map may be similar to the example height map 600 described in FIG. 6, or may be different. The heights of the height map may be measured using, for example, the topography sensor 130 shown in FIG. 1. In some embodiments, a vertical stage position may be determined from each height measurement in the height map to generate a corresponding "vertical stage position map." In step 710, a separate height measurement value may be assigned to each substrate location (e.g. generating a height map as in FIGS. 6A-B) rather than assigning a single height value to a zone of the substrate that comprises multiple locations (e.g. generating height zones as in FIG. 3)

At steps 720 and 730, a scanning lithography process is performed. The scanning lithography process may be similar to that described previously in FIGS. 1-2, and 4A-D. For example, as the illuminated pattern (e.g., incident radiation 126 in FIG. 2) is scanned over the substrate, the location of the illuminated region of the substrate corresponds to a particular location on the substrate, which is associated with a height at or near that substrate location in accordance with the height map. As the illuminated pattern is scanned across the substrate, the stage is configured to adjust its vertical position to a vertical stage position determined from the height at each location, which is determined from the height map. At each location, the stage may also adjust its tilt, the tilt determined from the height map. The vertical stage positions may be determined from the height map during scanning, or may be predetermined from the height map prior to scanning. In this manner, more of the surface of the substrate may be near the focal plane (e.g., focal plane 132 in FIG. 1) of the lithography system and thus the overall patterning of the substrate may be improved.

Figure 8:
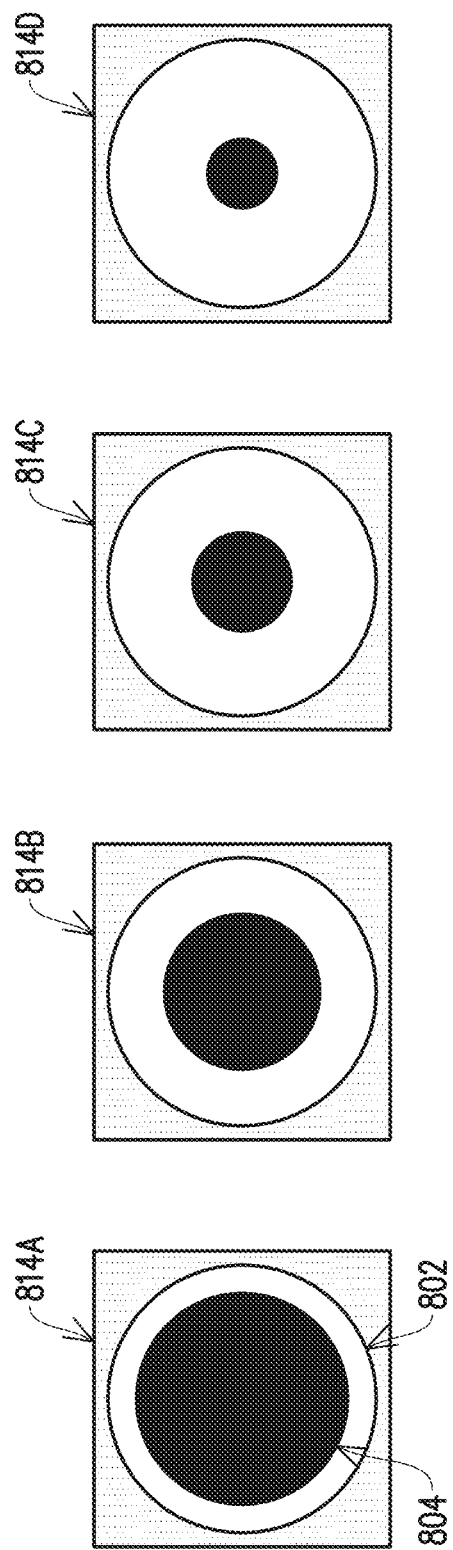
FIG. 8 illustrates exposure shields for a lithography process, in accordance with some embodiments.

Turning to FIG. 8, example exposure shields 814A-D are shown, in accordance with some embodiments. In some embodiments, one or more exposure shields (e.g., exposure shields 114 or 814A-D) may be placed in the path of the radiation beam of a lithography system to block a portion of the radiation. In this manner, with an exposure shield in place, the amount of radiation impinging on the substrate may be lessened, and thus the substrate may receive a smaller exposure dose of the radiation. For example, an exposure shield may be configured to reduce the amount of radiation between about 25% and about 75%. The exposure shields 814A-D may be similar to exposure shield 114 described with respect to FIG. 1, and may be used in a lithography system similar to lithography system 100. Each example exposure shield 814A-D blocks a different amount of radiation, with exposure shield 814A blocking the most amount of radiation and exposure shield 814D blocking the least amount of radiation.

In some embodiments, an exposure shield comprises a transparent region 802 and an opaque region 804. In some embodiments, the opaque region 804 may be formed by depositing a blocking material over portions of a transparent material. The opaque region 804 comprises regions in which the blocking material absorbs or reflects the radiation of the lithography system, and the transparent region 802 comprises regions in which the radiation is able to pass through the transparent material. The transparent material may be a material such as glass or another material that is approximately transparent to the radiation of the lithography system. The blocking material may be a material that absorbs or reflects the radiation of the lithography system, such as chrome, another metal material, or the like.

The amount of radiation that is blocked by an exposure shield may be determined by the fraction of the area of the transparent material that is covered by the opaque region 804. For example, an exposure shield having a larger fraction of the transparent material covered by its opaque region 804 blocks more radiation than an exposure shield having a smaller fraction covered by its opaque region 804. Referring to FIG. 8, exposure shield 814A has a larger opaque region 804 than exposure shield 814D, and thus exposure shield 814A blocks more radiation than exposure shield 814D. In some embodiments, the fraction of the transparent material that is covered by the opaque region may be between about 25% and about 75%. In other words, the amount of radiation that is allowed to pass through an exposure shield may be determined by the area of the transparent region 802 relative to the area of the opaque region 804. In some embodiments, the ratio of the area of the transparent region 802 to the area of the opaque region 804 may be between about 1:3 and about 3:1.

In some embodiments, the transparent region 802 and the opaque region 804 may be approximately circular, similar to exposure shields 814A-D shown in FIG. 8, with the transparent region 802 having an outer diameter that is larger than the diameter of the opaque region 804. In some embodiments, the opaque region 804 may have a diameter that is between about 25% and about 75% of the outer diameter of the transparent region 802. It will be appreciated that exposure shields may have transparent regions 802 or opaque regions 804 having different shapes than shown, such as rectangular shapes, polygonal shapes, irregular shapes, discontinuous shapes, or other shapes.

In some cases, the patterning of a substrate having different heights (e.g., a warped substrate as previously described) may be improved by adjusting the exposure dose of a location based on the height of the substrate at that location. For example, adjusting the exposure dose according to the height may allow improved patterning of finer features. Depending on the particular application and process, increasing the exposure dose at higher substrate locations may improve patterning or decreasing the exposure dose at higher substrate locations may improve patterning. In some embodiments, a scanning lithography process may include the use of one or more exposure shields (e.g., exposure shields 614A-D) to control the exposure dose at a substrate location based on the height of that location.

In some embodiments, a lithography system may place an exposure shield to reduce incident radiation at a location based on the height zone of the location. For example, with reference to FIGS. 3 and 4A-D, during a scanning step, the lithography system may place an exposure shield into the radiation path (e.g., 122 or 124 shown in FIG. 1) when the location of the illuminated region of the substrate is within height zone 300A, and remove the exposure shield from the radiation path when the location is within height zone 300B. Alternatively, the lithography system may switch to an appropriate exposure shield depending on the height zone of the location of the illuminated region of the substrate. For example, during a scanning step, the lithography system may use a first exposure shield when the location of the illuminated region of the substrate is within height zone 300A, and use a second exposure shield when the location is within height zone 300B. In some embodiments, the exposure shield may be placed, removed, or exchanged automatically by the lithography system (e.g., based on signals from the controller 132) or manually by a user. In this manner, the patterning of a substrate having different heights may be improved, and lithographic effects due to substrate warping may be reduced.

Figure 9:
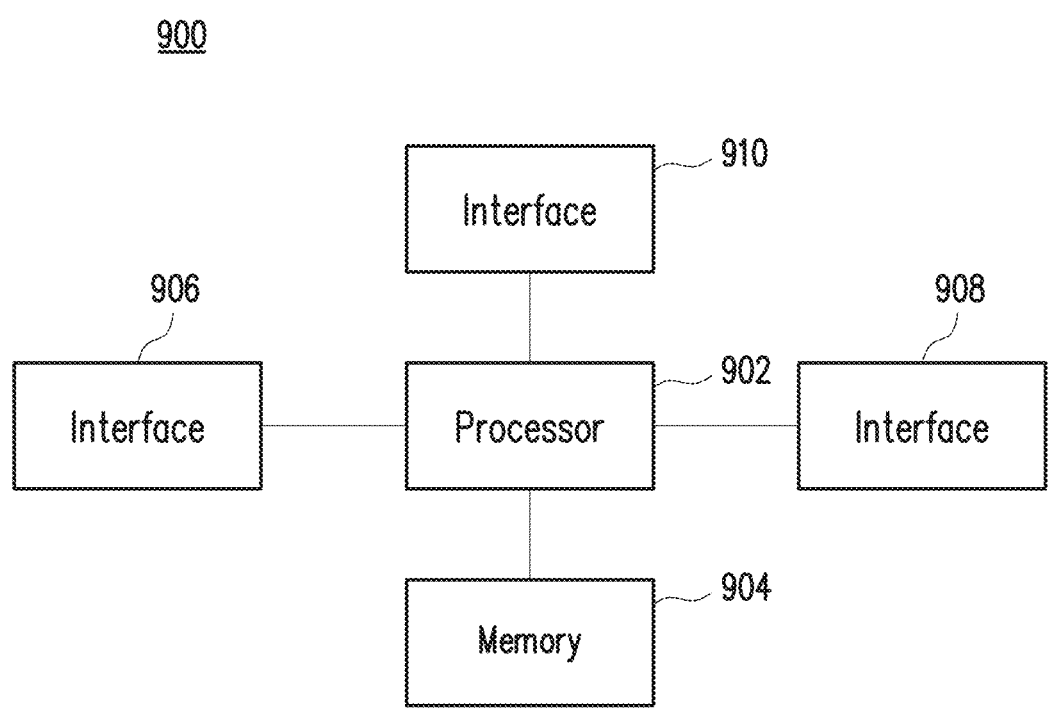
FIG. 9 illustrates a block diagram of a processing system, in accordance with some embodiments.

FIG. 9 is a block diagram of a processing system 900, in accordance with some embodiments. The processing system 900 may be used to perform lithography processes as described herein. The processing system 900 may be installed in a host device, such as the lithography system 100 shown in FIG. 1, and may be used for performing processes and techniques described herein (e.g., the processes shown in FIGS. 2-7), such as processes for moving the stage 102, measuring substrate heights using topography sensor 130, moving the mask 110, determining height zones or height maps, or controlling placement of exposure shields, if present. As shown, the processing system 900 includes a processor 902, a memory 904, and interfaces 906-910, which may (or may not) be arranged as shown in FIG. 9. The processor 902 may be any component or collection of components adapted to perform computations and/or other processing related tasks, and the memory 904 may be any component or collection of components adapted to store programming and/or instructions for execution by the processor 902, or, for example, to store data representing height zones or height maps. In an embodiment, the memory 904 includes a non-transitory computer readable medium. The interfaces 906, 908, 910 may be any component or collection of components that allow the processing system 900 to communicate with other devices/components and/or a user. For example, one or more of the interfaces 906, 908, 910 may be adapted to communicate data, control, or management messages from the processor 902 to applications installed on the host device and/or a remote device. As another example, one or more of the interfaces 906, 908, 910 may be adapted to allow a user or user device (e.g., personal computer (PC), etc.) to interact/communicate with the processing system 900. In some embodiments, an interface 906, 908, 910 may comprise a controller (e.g. controller 132) configured to receive signals from components, transmit signals to components or otherwise control the operation of components. For example, the controller may be configured to control the position (e.g., lateral, vertical, tilt, rotation, etc.) of the stage 102. The processing system 900 may include additional components not depicted in FIG. 9, such as long term storage (e.g., non-volatile memory, etc.).

Various embodiments use height measurements of a substrate to adjust the stage during a lithography process, such as a during a full wafer scanning lithography process. The vertical position of the stage is adjusted based on a height of the substrate in the region being illuminated. The vertical position of the stage may be adjusted during scanning to maintain the surface of the substrate currently in the illuminated region at or near a focal plane of the lithography system. The tilt of the stage may also be adjusted to maintain illuminated region of the substrate in a level orientation. The vertical position may be adjusted based on a height zone of the substrate or based on a height map of the substrate, in some embodiments. Additionally, an exposure shield may be used to control the exposure dose of the illuminated region based on its height. By adjusting the vertical position of the stage according to the height of a location on a substrate, the patterning of a substrate with large height variation, such as a warped substrate, may be improved. The use of one or more exposure shields to control exposure dose can also compensate for large height variation and improve patterning. Additionally, by using a full wafer scanning process, undesirable effects or misalignment to due stepping or stitching may be avoided.

In an embodiment, a method includes placing a substrate on a stage of a lithography system, measuring a first height of the substrate at a first location on the substrate, measuring a second height of the substrate at a second location on the substrate, and performing a lithographic patterning process on the substrate, comprising directing a patterned beam of radiation at the substrate, moving the stage laterally to align the first location of the substrate with the patterned beam, moving the stage vertically to a first vertical position, the first vertical position based on the first height, moving the stage laterally to align the second location of the substrate with the patterned beam, and moving the stage vertically to a second vertical position, the second vertical position based on the second height. In an embodiment, the lithographic patterning process further includes tilting the stage to level the substrate. In an embodiment, the lithographic patterning process includes placing an exposure shield within the patterned beam based on the first height and removing the exposure shield from within the patterned beam based on the second height. In an embodiment, the method also includes determining a first region of the substrate and a second region of the surface of the substrate, wherein the first vertical position is associated with the first region of the substrate and the second vertical position is associated with the second region of the substrate. In an embodiment, each location of the substrate within the first of the substrate has a height that is closer to the first height than the second height. In an embodiment, the first region surrounds the second region. In an embodiment, the method also includes measuring a third height of the substrate at a third location on the substrate, wherein performing a lithographic patterning process on the substrate also includes moving the stage laterally to align the third location of the substrate with the patterned beam and moving the stage vertically to the first vertical position. In an embodiment, moving the stage vertically to the first vertical position vertically aligns the first location with a focal plane of the lithography system. In an embodiment, performing a lithographic patterning process on the substrate includes scanning the patterned beam of radiation from a first edge of the substrate to a second edge of the substrate laterally opposite the first edge.

In an embodiment, a method includes generating multiple height measurements of a surface of a substrate, based on the multiple height measurements, determining multiple regions of the surface of the substrate, determining multiple vertical stage positions, wherein each vertical stage position of the multiple vertical stage positions is associated with a respective region of the multiple regions, performing a lithographic scanning process on a location of the substrate, including identifying the region of the multiple regions that is associated with the location of the substrate, moving the substrate to the vertical stage position that is associated with the identified region, and exposing the location of the substrate to an illuminated pattern. In an embodiment, performing a lithographic scanning process on a location of the substrate further includes adjusting a tilt of the substrate to level the identified region of the substrate. In an embodiment, a first region of the multiple regions includes first multiple locations on the substrate, and a second region of the multiple regions includes second multiple locations, wherein the locations of the first multiple locations are closer to an edge of the substrate than the locations of the second multiple locations. In an embodiment, the method also includes, based on the multiple height measurements, leveling the surface of the substrate by adjusting the orientation of the substrate. In an embodiment, the vertical stage position associated with a respective region is determined is determined from an average of height measurements of locations within that region. In an embodiment, the method also includes simultaneously moving the substrate to laterally align the location of the substrate with the illuminated pattern while moving the substrate to the vertical stage position that is associated with the identified region. In an embodiment, the multiple height measurements correspond to respective locations on the substrate that are arranged in a grid pattern over the substrate.

In an embodiment, a lithography system includes a controller, a moveable stage configured to hold a wafer, the moveable stage coupled to the controller and configured to move to a stage position based on a position signal received from the controller, an optical system configured to receive radiation transmitted through a patterned mask and direct it to a surface of the wafer, and a height sensor configured to measure a height of the surface of the wafer, the height sensor coupled to the controller and configured to transmit a height signal to the controller indicating the measured height, wherein the controller is configured to receive a first height signal from the height sensor indicating a first height of the surface of the wafer at a first wafer location and receive a second height signal from the height sensor indicating a second height of the surface of the wafer at a second wafer location, wherein the controller is configured to send a first position signal to the moveable stage to position the moveable stage at a first position when the optical system is directing radiation at the first wafer location and send a second position signal to the moveable stage to position the moveable stage at a second position when the optical system is directing radiation at the second wafer location. In an embodiment, the height sensor includes an optical height sensor. In an embodiment, the lithography system also includes an exposure shield configured to block a fraction of the radiation transmitted through the patterned mask. In an embodiment, the first position corresponds to a focal length of the optical system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   placing a substrate on a stage of a lithography system;
   measuring a first height of the substrate at a first location on the substrate;
   measuring a second height of the substrate at a second location on the substrate; and
   performing a lithographic patterning process on the substrate, comprising:
   directing a patterned beam of radiation at the substrate;
   moving the stage to a first lateral position and a first vertical position, wherein the first lateral position aligns a third location of the substrate with the patterned beam, wherein the third location is at a first edge of the substrate, and wherein the first vertical position is based on the first height;
   continuously moving the stage in a first lateral direction to a second lateral position, wherein the second lateral position aligns a fourth location of the substrate with the patterned beam, wherein the fourth location is at a second edge of the substrate opposite the first edge, comprising moving the stage vertically to a second vertical position while continuously moving the stage in the first lateral direction such that the stage is in the second vertical position when a fifth location of the substrate is aligned with the patterned beam, wherein the fifth location is between the third location and the fourth location, and wherein the second vertical position is based on the second height; and
   placing an exposure shield within the patterned beam based on the first height and removing the exposure shield from within the patterned beam based on the second height, the exposure shield controlling exposure dose of the patterned beam of radiation based on height.

2. The method of claim 1, wherein the lithographic patterning process further comprises tilting the stage to level the substrate.

3. The method of claim 1, further comprising determining a first region of the substrate and a second region of the surface of the substrate, wherein the first vertical position is associated with the first region of the substrate and the second vertical position is associated with the second region of the substrate.

4. The method of claim 3, wherein each location of the substrate within the first region of the substrate has a height that is closer to the first height than the second height.

5. The method of claim 3, wherein the first region surrounds the second region.

6. The method of claim 1, wherein moving the stage vertically to the first vertical position vertically aligns the first location with a focal plane of the lithography system.

7. The method of claim 1, wherein performing a lithographic patterning process on the substrate further comprises continuously scanning the patterned beam of radiation from the second edge of the substrate to the first edge of the substrate.

8. The method of claim 1, wherein continuously moving the stage in a first lateral direction to a second lateral position further comprises moving the stage vertically to a third vertical position while continuously moving the stage in the first lateral direction such that the stage is in the third vertical position when the stage is in the second lateral position, wherein the third vertical position is based on the first height.

9. The method of claim 1, wherein the exposure shield reduces the radiation of the patterned beam by an amount in a range from 25% to 75%.

10. A method comprising:
    generating a plurality of height measurements of a surface of a substrate;
    based on the plurality of height measurements, determining a plurality of regions of the surface of the substrate;
    determining a plurality of vertical stage positions, wherein each vertical stage position of the plurality of vertical stage positions is associated with a respective region of the plurality of regions; and
    performing a lithographic scanning process on the substrate, comprising:
    identifying a first region of the plurality of regions that is associated with a first plurality of locations on the substrate, the first plurality of locations extending continuously along a first lateral direction;
    moving the substrate to a first vertical stage position that is associated with the identified first region;
    while the substrate is held in the first vertical stage position, placing an exposure shield over the substrate;
    while the substrate is held in the first vertical stage position, scanning an illuminated pattern in the first lateral direction across the first plurality of locations, the exposure shield configured to control the exposure dose of the illuminated pattern based on height measurements of the first plurality of locations;
    identifying a second region of the plurality of regions that is associated with a second plurality of locations on the substrate, the second plurality of locations extending continuously along the first lateral direction and offset from the first plurality of locations in a second lateral direction perpendicular to the first lateral direction;

after scanning the illuminated pattern across the first plurality of locations, moving the substrate to a second vertical stage position that is associated with the identified second region, wherein the second vertical stage position is different from the first vertical stage position; and while the substrate is held in the second vertical stage position, scanning the illuminated pattern in the first lateral direction across the second plurality of locations.

11. The method of claim 10, wherein performing a lithographic scanning process on the substrate further comprises adjusting a tilt of the substrate to level the first region of the substrate.

12. The method of claim 10, wherein the locations of the first plurality of locations are closer to an edge of the substrate than the locations of the second plurality of locations.

13. The method of claim 10, further comprising, based on the plurality of height measurements, leveling the surface of the substrate by adjusting the orientation of the substrate.

14. The method of claim 10, wherein the vertical stage position associated with a respective region is determined is determined from an average of height measurements of locations within that region.

15. The method of claim 10, further comprising simultaneously moving the substrate to laterally align a location of the first plurality of locations with the illuminated pattern while moving the substrate to the vertical stage position that is associated with the first region.

16. The method of claim 10, wherein the plurality of height measurements correspond to respective locations on the substrate that are arranged in a grid pattern over the substrate.

17. The method of claim 10, wherein the first region surrounds the second region.

18. A lithography system comprising:

a controller;

a moveable stage configured to hold a wafer, the moveable stage coupled to the controller and configured to move to a stage position based on a position signal received from the controller;

an optical system configured to receive radiation transmitted through a patterned mask and direct it to illuminate a surface portion of the wafer;

a height sensor configured to measure a height of the surface of the wafer, the height sensor coupled to the controller and configured to transmit a height signal to the controller indicating the measured height;

an exposure shield configured to block a fraction of the radiation transmitted through the patterned mask to control an exposure dose of radiation based on the measured height;

wherein the controller is configured to receive a first height signal from the height sensor indicating a first height of the surface of the wafer corresponding to a first region of wafer locations and receive a second height signal from the height sensor indicating a second height of the surface of the wafer corresponding to a second region of wafer locations, wherein the controller is configured to send signals to the moveable stage to move the wafer in a series of parallel scans, each parallel scan illuminating a respective surface portion of the wafer that extends fully across the wafer, send a first position signal to the moveable stage to position the moveable stage at a first vertical position when the optical system is illuminating a location within the first region of wafer locations and send a second position signal to the moveable stage to position the moveable stage at a second vertical position when the optical system is illuminating a location within the second region of wafer locations, wherein the first region of wafer locations extends contiguously across the surface portion of a first parallel scan of the series of parallel scans and the surface portion of a second parallel scan of the series of parallel scans, wherein more locations of the first region of wafer locations are within the surface portion of the first parallel scan than are within the surface portion of the second parallel scan.

19. The lithography system of claim 18, wherein the height sensor comprises an optical height sensor.

20. The lithography system of claim 18, wherein the first position corresponds to a focal length of the optical system.

* * * * *